Feb. 9, 1965 B. A. KAUFMAN 3,169,198

TUNNEL DIODE SYSTEMS FOR PULSE LOGIC

Filed April 17, 1961 3 Sheets-Sheet 1

INVENTOR:
Bruce A. Kaufman

Louis A. Kline

By John J. Matlago

Mary L. Young

His Attorneys.

Feb. 9, 1965 B. A. KAUFMAN 3,169,198

TUNNEL DIODE SYSTEMS FOR PULSE LOGIC

Filed April 17, 1961 3 Sheets-Sheet 2

INVENTOR:
Bruce A. Kaufman
Louis A. Kline
By John J. Maclaga
Murray L. Young
His Attorneys.

INVENTOR:
Bruce A. Kaufman
By Louis A. Kline
John J. Matlago
Murray L. Young
His Attorneys.

United States Patent Office 3,169,198
Patented Feb. 9, 1965

3,169,198

TUNNEL DIODE SYSTEMS FOR PULSE LOGIC

Bruce A. Kaufman, Los Angeles, Calif., assignor to The National Cash Register Company, Dayton, Ohio, a corporation of Maryland Filed Apr. 17, 1961, Ser. No. 103,558
11 Claims. (Cl. 307—88.5)

The present invention relates to systems in which logical operations are performed upon information represented in binary signal form, and more particularly relates to such systems employing tunnel diodes as the logical elements.

In the field of solid state circuits, a great deal of interest has been centered on a p-n junction diode wherein the concentration of impurities on both sides of the junction have been significantly increased relative to conventional p-n junction diodes. An unusual phenomenon of this diode, as discovered by Dr. Leo Esaki in 1957, includes an unusually high conductivity under the presence of a potential bias in the range generally below 100 millivolts followed by a negative resistance in the range generally between 100 and 300 millivolts. This increased conductivity may be explained as the effect of a relative shift of energy levels on each side of the junction barrier upon application of a small forward potential bias which places electron energy states in the conductance band on the n side of the junction at energy levels of vacant energy states in the valence band on the p side of the junction resulting in an increased probability of electrons penetrating the junction barrier. The tunnel diode takes its name from this penetration or "tunnelling" effect. As the forward bias across the junction further increases, the "tunnelling" effect subsides and when the forward bias has become sufficient to overcome the junction barrier, minority carrier injection takes place giving rise to the normal characteristics of a p-n junction diode.

Since the tunnel diode possesses a voltage-current relationship characterized by a negative resistance region between two positive resistance regions, there exist many possibilities for useful applications of this diode as a computer switching component. The present invention is concerned with the use of the tunnel diode as a logic switch where the tunnel diode has particular advantages because of its extremely fast "switching" speed.

Because of the low voltage levels and low currents involved with the operation of tunnel diodes, the practical utilization of the tunnel diode in logic circuitry has heretofore been limited due to, among other things, the incompatibility between tunnel diodes and conventional circuit elements such as diodes, cores, and transistors which possess relatively higher voltage and current thresholds. Furthermore, heretofore known direct coupled logic circuits composed of tunnel diodes have been very sensitive to diode terminal characteristics which cannot yet be closely controlled, at least in respect to commercial production.

Because the tunnel diode is a two terminal device in which input and output pulses appear at the same terminal, various techniques of interstage coupling of tunnel diode circuits must be devised to overcome the inherent problem of insuring directivity of information flow. One such interstage coupling means involves the employment of unidirectional devices between the respective elements. Other interstage coupling techniques include employing a three-beat clock. With such couplings between tunnel diodes, the pulse outputs of individual tunnel diodes are critically affected by the input pulse shapes, the amplitude and timing of which must be carefully controlled. The present invention relates to the application of tunnel diode circuits to inhibit logic system techniques wherein the burden of controlling the pulse shape, amplitude, and timing is shifted to a clock source.

It is a major object of this invention to provide an improved pulse logic system employing tunnel diode circuit elements. Another object of this invention is the provision of an improved system of tunnel diode circuit elements arranged in cascaded operating stages, each stage of which comprises one or a plurality of simultaneously operating logical circuits. Still another object of this invention is the provision of an improved system of tunnel diode circuit elements wherein information transfer is controlled by a clock pulse.

In essence, inhibit logic techniques employ information inputs in the form of binary signals representing the information status, to either inhibit or not inhibit the clock signals that normally trigger or drive the logical circuits such that the resulting output represents a logical function of the information inputs. A significant feature, then, of this invention resides in a system which comprises means including a tunnel diode which when triggered is effective to produce an output signal representing a logical function defined by a Boolean equation. The tunnel diode is supplied with a clock signal which recurrently tends to trigger the tunnel diode. The tunnel diode is simultaneously supplied with logical input signals, representing the current status of respective variables defined in the Boolean equation, which logical signals are utilized to prevent triggering of the tunnel diode, whereby the produced output signal represents the current status of the function defined by the Boolean equation. In order to insure a unilateral flow of information, a second feature of the invention resides in the provision of delay means between the elements of the system to prevent signals from the succeeding elements arriving back at preceding elements in synchronization with the supply of clock pulses to latter elements.

Other objects, advantages, and features will become apparent from the following specification and appended claims taken in conjunction with the drawings wherein:

Figures 1, 2, 3, 5:
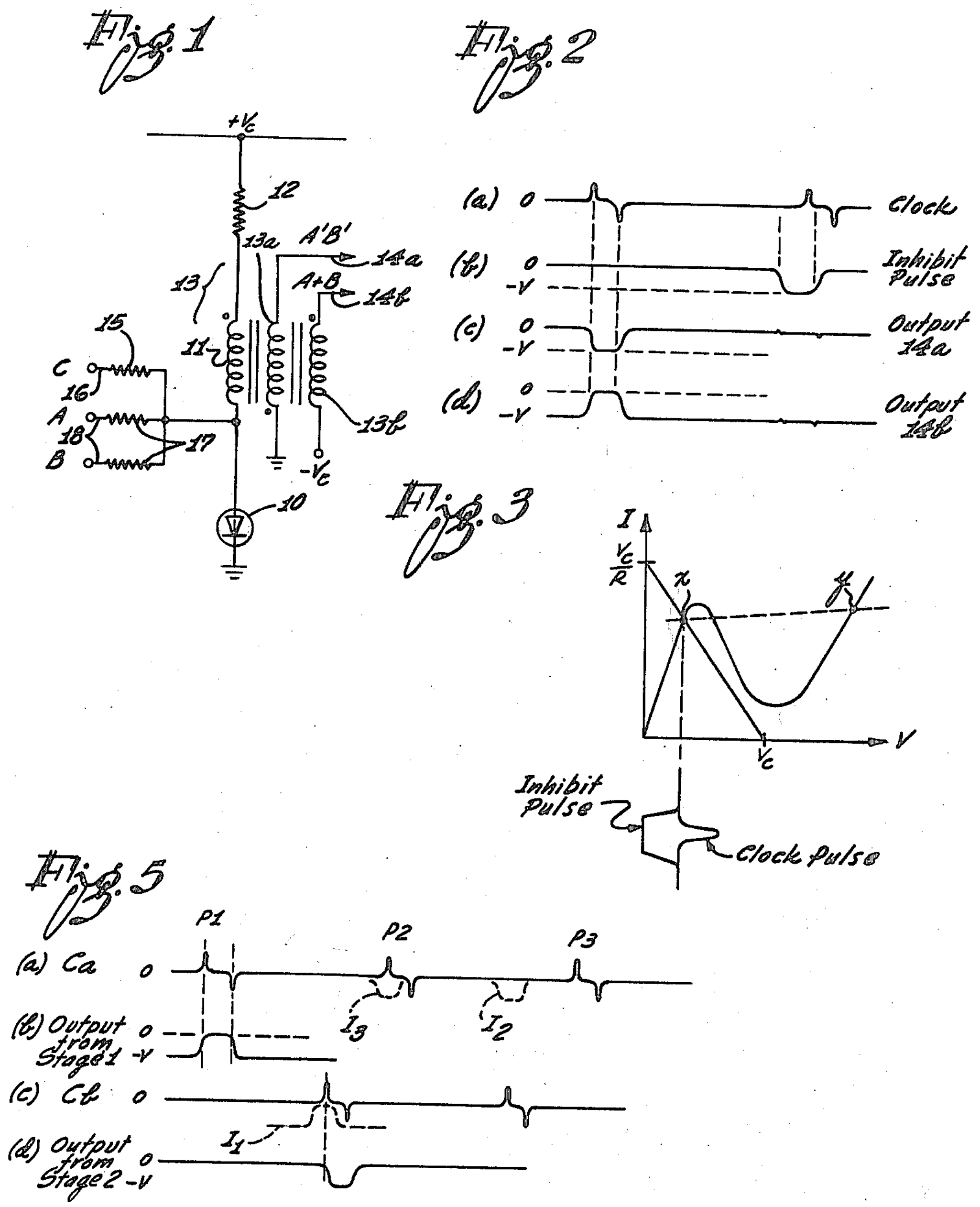
FIG. 1 is a schematic drawing of an exemplary tunnel diode inhibit logic circuit.
FIG. 2 is a set of voltage waveforms illustrating the input and output pulses of the circuit shown in FIG. 1.
FIG. 3 is a diagram of the voltage-current characteristic for the tunnel diode.
FIG. 5 is a set of voltage-time curves illustrating the timing relations for a two phase clock operation.

Referring to FIG. 1, the basic tunnel diode circuit embodying the present invention will now be described. This circuit includes tunnel diode 10, the n side of which is grounded, in series with primary winding 11 of pulse transformer 13 and load resistance 12 to which is connected positive voltage source $V_c$. In addition to primary winding 11, the pulse transformer 13 is provided with a first secondary winding 13*a*, which is coupled to output lead 14*a* and is so wound as to have a polarity opposite to that of primary winding 11, and a second secondary winding 13*b* coupled to output lead 14*b* and so wound as to have the same polarity as primary winding 11. It will be noted in FIG. 1 that the first secondary winding is connected to ground while the second secondary winding is connected to a negative voltage source $-V_c$. To utilize the circuit, there is provided one or more input leads 18, each connected through a respective resistor 17 to the junction between tunnel diode 10 and primary winding 11, and a clock input lead 16 which is connected through a resistor 15 to the same junction.

It should be noted that the electrical bias of the tunnel diode may be reversed if desired so long as the potential rise from the n to the p side of the diode is maintained positive. For such an application, the respective voltage sources and signal polarities would also be reversed in reference to the circuit of FIG. 1.

In the preferred embodiment of the present invention, the tunnel diode is maintained under conditions which result in a monostable operation as illustrated in FIG. 3 where the values of the positive voltage supply $V_c$ and the load resistance R of resistor 12 are so chosen that the load line will intersect the voltage current characteristic curve of the tunnel diode but once (point $x$) and thus the tunnel diode will normally operate at this point until perturbed by a forward bias pulse of sufficient magnitude to carry the diode operating potential into the negative resistance region at which time the diode will switch to point $y$ on the current voltage characteristic curve for a period of time determined by the $L/R$ time constant dependent on the net inductance of primary winding 11 and the resistance of load resistance 12, after which period the voltage of the diode will return to stable operating point $x$.

In the present invention, the forward bias pulse is a positive going clock pulse supplied to the circuit shown in FIG. 1 through clock pulse lead 16 and resistor 15. In order to produce on output lead 14*a*, or output lead 14*b*, an output pulse having a sufficient degree of rectangularity, the primary inductance L is increased so that the $L/R$ time constant is significantly large and the clock pulses are supplied in sets of a positive clock pulse and a following negative clock pulse wherein the negative clock pulse actually serves to reset or drive the tunnel diode from point $y$ to point $x$ on the voltage current characteristic curve. An advantage of this approach is that the duration and shape of the output pulse on either output lead 14*a* or output lead 14*b* is controlled by the positive and negative clock pulses rather than by the operating conditions of the tunnel diode circuit with a resulting increased uniformity of output pulse slopes. This advantage takes on greater significance when a plurality of stages employing tunnel diodes are arranged in a system, the synchronous operation of which is dependent upon the uniformity of pulse shapes and duration throughout the circuit.

In the present invention, then, the exemplary circuit, as shown in FIG. 1 is one which is recurrently triggered or driven by clock pulse sets and the circuit is utilized as a logic element by supplying input signals in the form of negative voltage pulses along either of input leads 18 in a manner such that these negative pulses coincide with and inhibit the positive going pulse of the clock pulse set, thereby preventing the triggering of the circuit and the resultant output pulse on either output lead 14*a* or output lead 14*b*. In FIG. 2 there is shown a set of waveforms wherein waveform (*a*) is representative of the recurrent or periodic clock pulse sets, waveform (*b*) is exemplary of input signals on a given input lead, waveform (*c*) represents the resultant output signals on output lead 14*a*, and waveform (*d*) is representative of the resultant output signals on output lead 14*b*. It will be noted in regard to FIG. 2 that the first clock pulse set does not coincide with an inhibit pulse and therefore results in output pulses on both output leads 14*a* and 14*b*. In contrast, therewith, an input pulse on any one or more of the input leads 18 does coincide with the positive going pulse of the second clock pulse set, with no resultant output pulses. Since the first secondary winding 13*a* coupled to output lead 14*a* is grounded and wound with a polarity opposite to that of primary winding 11, the voltage level appearing on output lead 14*a* will normally be at 0 volts and the resultant output signal will take the form of a negative going pulse commencing with the triggering of the circuit by the positive going clock pulse and continuing until resetting of the circuit by the negative going clock pulse. Similarly, since the second secondary winding 13*b* coupled with output lead 14*b* is connected to a $-V_c$ voltage source and wound with the same polarity as primary winding 11, the voltage level on output lead 14*b* will normally be at $-V_c$ with the resultant output pulse being positive in nature and commencing with the positive going pulse of the clock pulse set and continuing until the circuit is reset by the negative going pulse thereof.

Various logical operations may be performed on the circuit in FIG. 1, which operations may be defined in terms of Boolean algebra, wherein an operating potential level of zero volts corresponds to the false state of a term as defined in a Boolean equation and a negative operating potential of $-V$ volts corresponds to the true state of a term as defined in a Boolean equation. Thus with the circuit shown in FIG. 1, wherein the signals received on input leads 18 represent the logical terms A and B respectively, at clock time, a negative potential (true) pulse will be observed on output lead 14*a* only when the potential levels on both of the input leads 18 are at zero volts (false). The output pulse on output lead 14*a*, then, may be expressed as representing the logical expression A′B′ which is equivalent to the negated "or" expression $(A+B)'$. Because of the manner in which both the first and the second secondary windings of transformer 13 are wound and electrically biased, as described above, the potential on output lead 14*b* will always be opposite to that of the potential on output lead 14*a*, that is, when the potential on output lead 14*a* is zero volts, the potential on output lead 14*b* will be $-V$ volts. Therefore, for the input signals as described above, the output pulse on output lead 14*b* will be representative of the logical "or" expression, $A+B$.

Similarly, the circuit shown in FIG. 1 can be used to provide the negated "and" function by inverting the input signals before they are supplied to leads 18. Thus if input signals A and B are inverted (so that in each case a zero volt potential will represent the false state of the complement of the respective term and a $-V_c$ volt potential will represent a true state of such a complement) the resultant output signal on the lead 14*a* will then be representative of the logical expression AB and the output signal on output lead 14*b* will be representative of the inverse of this expression namely the negated "and" expression (AB)′ or $A'+B'$.

It will be noted in regard to FIG. 1 that if but a single input lead is provided, and output signal on output lead is provided, and output signal on output lead 14*a* will always represent the inverse logical function of this input while the output on lead 14*b* will be representative of the input itself, that is, the circuit will merely translate the information represented by the input signal.

When utilizing the circuit of FIG. 1 in any logic system, as will be discussed later, it is to be noted that such a system will be synchronous in that the respective input and output signals have significance only at that time when the logic element is being triggered by a clock pulse set.

Next to be described is the clocking arrangement provided for enabling a multi-stage system comprised of these tunnel diode logical circuits to operate.

Figure 4:
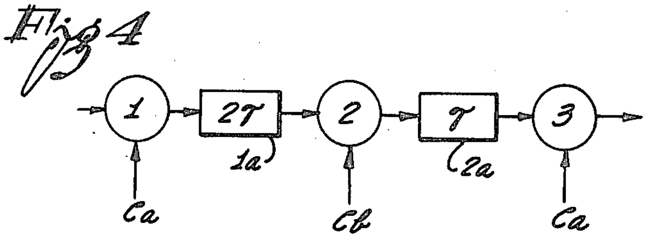
FIG. 4 is a generalized drawing of a logic system employing a two phase clock operation.

Since information is effectively transferred from one stage to the next with each positive and negative clock pulse set, unilateralization of information flow may be accomplished by staggering the clock pulse sets supplied to successive stages. A phased two source clock system for accomplishing this unilateralization is generally illustrated in FIG. 4. The voltage-time curves for this system are illustrated in FIG. 5 wherein the input pulse $I_1$ to stage 2 results from a clock pulse set supplied to stage 1 from suorce C*a*, and this input is delayed by delay line 1a so as to arrive at stage 2 in synchronization with the clock pulse set from source Cb which is delayed from the clock pulse set from source Ca by a controlled amount. When there is a high input pulse (0 v.) to stage 2, this stage will emit an output pulse which will appear at both stage 1 (pulse $I_2$) and stage 3 (pulse $I_3$) of the system, arriving at stage 3 through delay line 2a and at stage 1 through delay line 1a. However, the delay time between stages 2 and 3 is chosen to be some fraction of the delay time between stages 1 and 2 and the relationship between clock pulse sets from source Cb and Ca is such that the output of stage 2 will arrive at stage 3 in synchronization with the clock pulse set to stage 3 but will not arrive at stage 1 in synchronization with the clock pulse set to stage 1, thereby insuring unilaterization of information flow. This arrangement requires only two properly phased clock pulse sources with every other stage receiving clock pulse sets from the same source.

Figure 6:
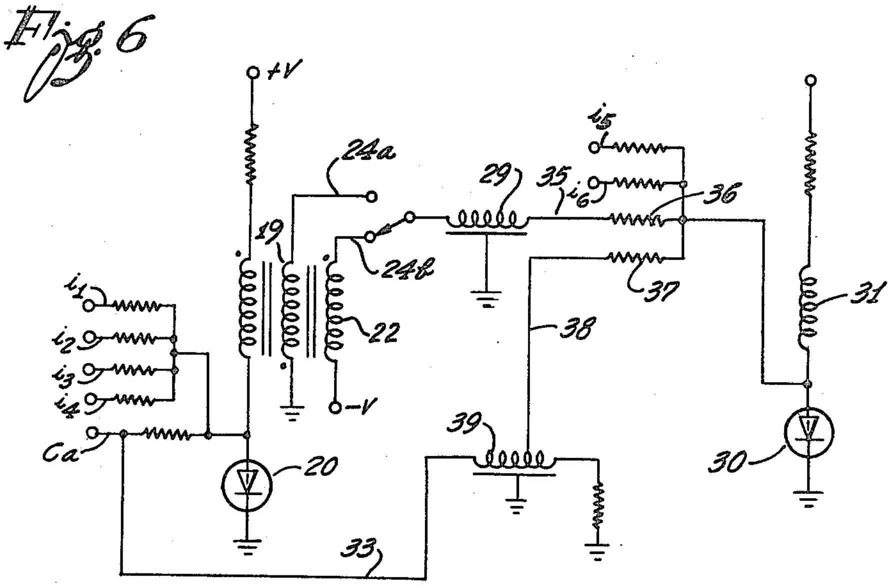
FIG. 6 is a schematic drawing of a circuit utilizing a two phase clock.

Referring to FIG. 6, an arrangement is shown wherein the clock pulse set transmitted to stage 1, including tunnel diode 20, is also utilized to trigger stage 2, including tunnel diode 30. The output from stage 1 is taken from either output lead 24a of winding 19 or output lead 24b of winding 22, which are similar in nature to output lead 14a of winding 13a and output lead 14b of winding 13b, as shown in FIG. 1, and this output is delayed by delay line 29 before arriving at input lead 35 and resistance 36 of stage 2. The input to the second stage is received at the junction between diode 30 and winding 31 with the clock pulse set for the second stage being received through resistance 37 and input lead 38, the clock pulse set arriving from delay line 39, and lead 33 which is coupled to the same clock pulse set source, Ca, as serves stage 1. Delay line 29 and delay line 39 are so chosen that the delayed clock pulse set and the delayed output from stage 1 arrive at stage 2 in synchronization with one another.

Figure 7:
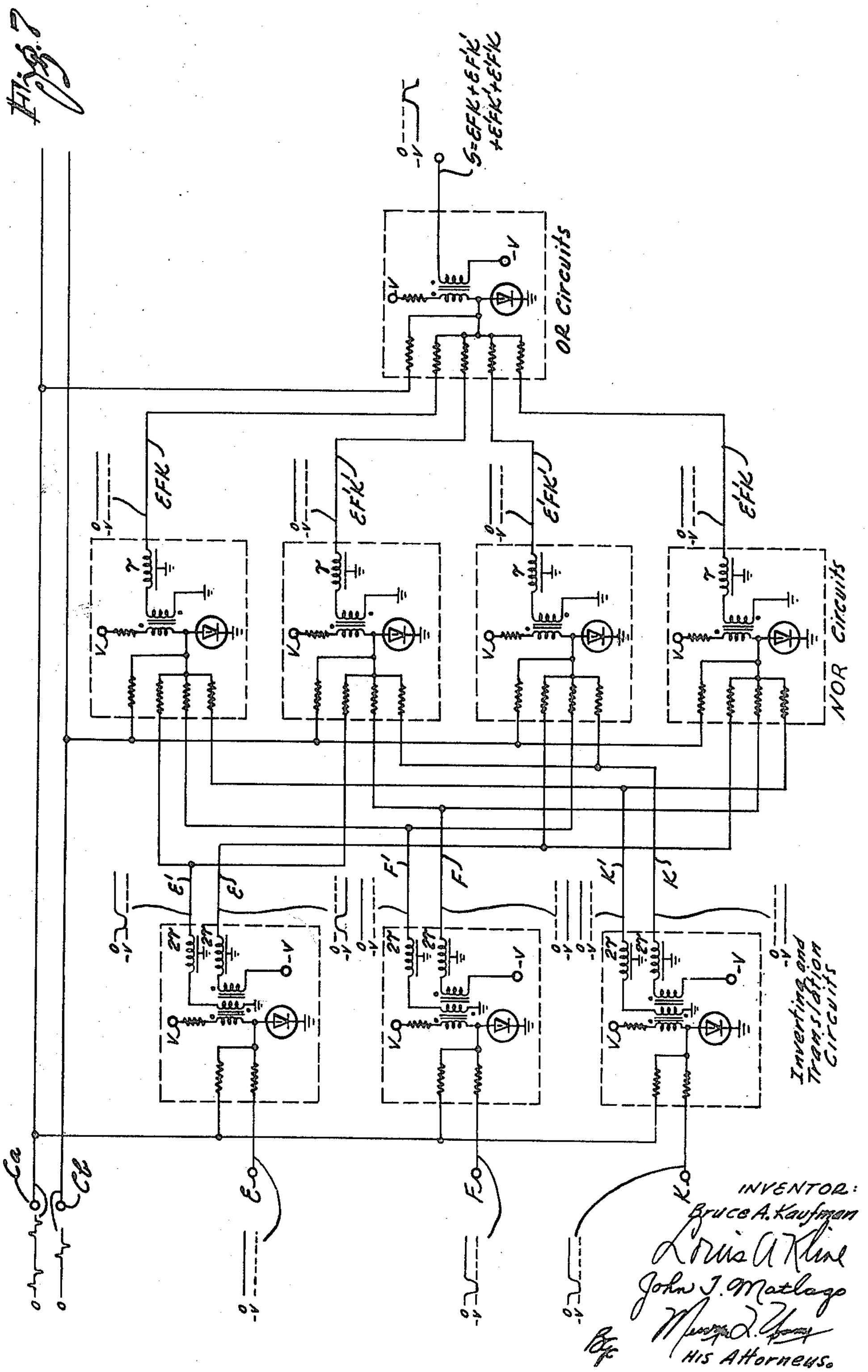
FIG. 7 is a schematic drawing of an exemplary circuit for a pulse logic system implemented by tunnel diode inhibit logic circuits.

Any system for mechanizing a logical equation may be constructed by utilizing various modifications of exemplary logical circuit shown in FIG. 1. Referring now to FIG. 7, there is shown a system for the mechanization of the Boolean equation, $S=EFK+EF'K'+E'FK'+E'F'K$, where the primes denote the complements of the respective variables in the equation. This system is composed of essentially three sequentially timed operating stages which perform the "inversion" (i.e. negation), "nor" and "or" operations, respectively. In addition, each stage delays its output signals by respective durations corresponding to the requirements for a 2-phase clock as employed in this system.

It is observed that a negated "and" or "nand" circuit will have a negative output potential level (1 or "true") only when this stage does not receive any negative potential level input pulses representing a complemented input function (i.e. to produce the function EF'K', the inputs are chosen as E', F and K and $EF'K'=1$ when $E'=F=K=0$). On the other hand, the "or" circuit will have a negative output potential level (1 or "true") whenever this stage receives a negative potential level ("true") input pulse, i.e., to produce the function $(EFK)+EF'K')$, the inputs are (EFK) and (EF'K') and $(EFK)+(EF'K')=1$ when either (EFK) or (EF'K') is 1.

Many important implications to computer technology are inherent in the inhibit logic technique which has been applied to tunnel diode systems such as described above. One basic difficulty with previously employed techniques has been the lack of a simple method for logical negation with direct coupled tunnel diode circuits, and such a method is readily available with the technique as disclosed herein. This approach also eliminates the necessity for unidirectional devices and other means required to insure unilateralization of the information flow. More important, however, is the absence of severe tolerance requirements normally encountered to control the shape, amplitude, and timing of the input pulses which functions are now controlled by the clock source. In the light of the disclosure made herein, changes and modifications will, of course, be evident to those skilled in the art and hence it is not desired to limit the invention to the specific embodiments described.

What is claimed is:

1. A pulse logic system comprising: circuit means including a tunnel diode which when triggered is effective to produce an output signal, clock means for producing clock pulses having a polarity for recurrently tending to trigger said tunnel diode, and means for receiving input signals and for selectively utilizing said input signals to therewith prevent triggering of said tunnel diode whereby a produced output signal represents a logical function defined by a Boolean equation in dependence upon occurrence of signals representing the true statuses of respective variables defined in said equation.

2. A pulse logic system according to claim 1 wherein said clock means includes means for producing recurrent sets of pulses including at least one of said clock pulses followed by a resetting pulse.

3. A pulse logic system for selectively producing an output signal representing a logical function defined by a Boolean equation in dependence upon occurrence of negative voltage signals representing the true statuses of respective variables defined in the equation, said system comprising: circuit means including a tunnel diode which when triggered is effective to produce a negative voltage output signal, clock means for producing clock pulses having a positive voltage for recurrently tending to trigger said tunnel diode, means for receiving input signals representing the current status of respective ones of said variables and for selectively utilizing said input signals to therewith prevent triggering of the tunnel diode, whereby a produced output signal represents the nonoccurrence of a true status of any one of said variables.

4. A pulse logic system for selectively producing an output signal representing a logical function defined by a Boolean equation in dependence upon concurrence of negative voltage signals representing the true statuses of respective variables defined in the equation, said system comprising: circuit means including a tunnel diode which when triggered is effective to produce a negative voltage output signal, clock means for producing clock pulses having a positive voltage for recurrently tending to trigger said tunnel diode, means for receiving input signals representing the current status of respective ones of said variables and for producing respective signals representing the Boolean inverses of said variables, and means selectively utilizing only the signals representing said Boolean inverses of said variables to therewith prevent triggering of the tunnel diode, whereby a produced output signal represents concurrence of the true statuses of said variables.

5. A pulse logic system according to claim 4 including as means for producing the Boolean inverses of said variables: signal producing means for producing a negative voltage signal representing a true status of a logical function of one of said variables, second circuit means including a second tunnel diode which when triggered is effective to drive said signal producing means, clock means for producing second clock pulses having a positive voltage recurrently tending to trigger said second tunnel diode, and means for receiving an input signal representing the current status of one of said variables and selectively utilizing said input signal to therewith prevent triggering of said second tunnel diode whereby a signal is produced which represents the Boolean inverse of the said variable.

6. A pulse logic system for selectively producing an output signal representing a logical function defined by a Boolean equation in dependence upon occurrence of signals representing the true statuses of respective variables defined in the equation, said system comprising: signal producing means for producing a respective inhibiting output signal representing the Boolean inverse of a corresponding variable, a tunnel diode which when triggered is effective to drive said signal producing means, clock means for producing clock signals for recurrently tending to trigger said tunnel diode, and means for receiving an input signal representing the current status of said variable and selectively utilizing said input signal to therewith prevent triggering of the tunnel diode, whereby a produced output signal represents the Boolean inverse of the current statuses of the variable.

7. A pulse logic system for selectively producing an output signal representing a logical function defined by a Boolean equation in dependence upon occurrence of negative voltage signals representing the true statuses of respective variables defined in the equation, said system comprising: means for producing a biased output signal, circuit means including a tunnel diode which when triggered is effective to negate said biased output signal, clock means for producing clock signals for recurrently tending to trigger said tunnel diode, means for receiving input signals representing the current status of respective ones of said variables and selectively utilizing only the input signals representing the true statuses of the variables to prevent triggering of the tunnel diode whereby a produced output signal represents the occurrence of the true status of any one of the variables.

8. A circuit for performing a logical operation described by a Boolean equation which comprises a tunnel diode electrically biased to a given voltage level, a pulse transformer in series connection with said tunnel diode, clock means to provide periodic electrical pulses having a polarity to effectively trigger said tunnel diode to a different voltage level for production of a negative output pulse from said pulse transformer, and means for receiving input signals representing current statuses of the variables defined by the Bolean equation and selectively utilizing said signals to prevent triggering of the tunnel diode whereby a produced output signal represents a logical function of the variables defined by the Boolean equation.

9. A circuit for performing a logical operation comprising: circuit means including a pulse transformer in series connection with a tunnel diode which when triggered is effective to produce an output signal, clock means for producing clock pulses for recurrently tending to trigger said tunnel diode, said pulse transformer having first output windings and second output windings to respectively produce both an output signal representing a logical function and an opposite signal representing the Boolean inverse of said function.

10. A circuit for performing a logical operation comprising a first tunnel diode and a second tunnel diode each of which is electrically biased to a given voltage level, first clock means to provide periodic electrical pulses having a polarity to trigger the first tunnel diode to a different voltage level for emission of output pulses therefrom, second clock means to provide periodic electrical pulses having a polarity to trigger the second tunnel diode to a different voltage level, and delay means for delayed transmission of the output pulses from the first tunnel diode to the second tunnel diode, said second clock means including said first clock means and a clock pulse delay means to provide said periodic electrical pulses to form said second clock means the second tunnel diode in synchronization with said output pulses transmitted from the first tunnel diode, both of said delay means being timed as to provide unilateralization of information flow from said first tunnel diode to said second tunnel diode.

11. A system for performing a sequence of logical operations comprising a plurality of consecutive logical stages each of which includes a tunnel diode which when triggered produces an output pulse to be transmitted to the next succeeding stage, first clock means to supply first sets of clock pulses having a polarity to recurrently tend to trigger said tunnel diodes of every other stage of said system, and second clock means to supply second sets of clock pulses having a polarity to recurrently tend to trigger said tunnel diodes in the remaining stages of said system, said second clock means being adapted to supply said second sets of clock pulses at a time different from first sets of clock pulses supplied by said first clock means to provide unilateralization of information flow from stage to stage.

References Cited in the file of this patent

UNITED STATES PATENTS

| | | |
|---|---|---|
| 2,851,219 | Hussey | Sept. 9, 1958 |
| 2,962,212 | Schneider | Nov. 29, 1960 |
| 2,972,060 | Torrey | Feb. 14, 1961 |
| 3,008,056 | Wanlass | Nov. 7, 1961 |

OTHER REFERENCES

Lesk et al.: "Tunnel Diode Operation and Application," Electrical Engineering, April 1960.

Richards: Arithmetic Operations in Digital Computers, Van Nostrand, 1957.

UNITED STATES PATENT OFFICE
CERTIFICATE OF CORRECTION

Patent No. 3,169,198 February 9, 1965

Bruce A. Kaufman

It is hereby certified that error appears in the above numbered patent requiring correction and that the said Letters Patent should read as corrected below.

Column 4, line 75, for "suorce" read -- source --; column 7, line 37, for "Bolean" read -- Boolean --; column 8, line 16, for "to form said second clock means" read -- from said second clock means to --.

Signed and sealed this 6th day of July 1965.

(SEAL)
Attest:

ERNEST W. SWIDER
Attesting Officer

EDWARD J. BRENNER
Commissioner of Patents